US006657841B1

United States Patent
Melchert et al.

(10) Patent No.: US 6,657,841 B1
(45) Date of Patent: Dec. 2, 2003

(54) CIRCUIT ARRANGEMENT FOR THE OVERVOLTAGE PROTECTION OF A POWER TRANSISTOR FOR CONTROLLING AN INDUCTIVE LOAD

(75) Inventors: Wilhelm Melchert, Hennef (DE); Gerd Schmitz, Troisdorf (DE)

(73) Assignee: Moeller GmbH, Bonn (DE)

( * ) Notice: Subject to any disclaimer, the term of this patent is extended or adjusted under 35 U.S.C. 154(b) by 90 days.

(21) Appl. No.: 10/069,991

(22) PCT Filed: Aug. 9, 2000

(86) PCT No.: PCT/EP00/07715

§ 371 (c)(1),
(2), (4) Date: Mar. 1, 2002

(87) PCT Pub. No.: WO01/18965

PCT Pub. Date: Mar. 15, 2001

(30) Foreign Application Priority Data

Sep. 3, 1999 (DE) .......................... 199 42 023

(51) Int. Cl.$^7$ ................................. H02H 9/00
(52) U.S. Cl. .................. 361/100; 361/58; 361/78; 361/118
(58) Field of Search .................. 361/100, 2, 13, 361/78, 91.1, 118, 10, 56, 58

(56) References Cited

U.S. PATENT DOCUMENTS

| 4,074,334 | A | * | 2/1978 | D'Arrigo et al. | 361/79 |
| 4,250,531 | A | * | 2/1981 | Ahrens | 361/2 |
| 4,636,907 | A | * | 1/1987 | Howell | 361/13 |
| 5,131,030 | A | * | 7/1992 | Cameron | 379/373.01 |

FOREIGN PATENT DOCUMENTS

| DE | 4316830 | 11/1994 | ............ H02H/9/04 |
| EP | 0331251 | 9/1989 | ............ H02H/9/04 |
| EP | 0625867 | 11/1994 | ............ H05B/6/06 |
| EP | 0701313 | 3/1996 | ............ H02H/9/04 |
| FR | 2733648 | 10/1996 | ......... H03K/17/082 |
| JP | 02-241324 | 9/1990 | ............ B60L/3/00 |
| JP | 05-207647 | 8/1993 | ............ H04Q/3/58 |

\* cited by examiner

*Primary Examiner*—Stephen W. Jackson
(74) *Attorney, Agent, or Firm*—Davidson, Davidson & Kappel, LLC

(57) ABSTRACT

A circuit arrangement for overvoltage protection of a power transistor for controlling an inductive load includes a first varistor which bridges-over the supply connections. A second varistor is arranged parallel in relation to the switching path of the power transistor and in series with a switching transistor. The switching transistor can be controlled by a voltage divider which is connected to the supply voltage via a Zener diode.

5 Claims, 1 Drawing Sheet

CIRCUIT ARRANGEMENT FOR THE OVERVOLTAGE PROTECTION OF A POWER TRANSISTOR FOR CONTROLLING AN INDUCTIVE LOAD

BACKGROUND

The present invention relates in general to a circuit arrangement for overvoltage protection of a power transistor for controlling an inductive load, such as, for example, the drive coil of a magnetic drive.

A circuit arrangement for the overvoltage protection of a power transistor for pulse-width control of a motor winding as inductive load is known from European Patent Application EP-A2-0 331 251. This protection circuit contains a first varistor in parallel with the input of a rectifier as well as a second varistor in parallel with the switching path of a power transistor which, along with the motor winding and a limiting resistor, is connected to the output of the rectifier. The first varistor, within the limits of its thermal loading capacity, provides the coarse protection of the entire circuit whereas the fine protection for the power transistor is taken care of by the second varistor, a parallel arrangement composed of a diode and a resistor and preferably connected in series to second the varistor absorbing the energy caused by the limiting second varistor. Under its limiting level, a noticeable transverse current flows through the second varistor, which, on one hand, results in a not inconsiderable power loss and, on the other hand, permits no or at least only a considerably limited pulse-width control of the load current in certain applications and conditions, in particular, in connection with drive coils of magnetic drives in the holding mode.

To avoid a continuous current through a varistor, Japanese Patent Application JP-A-05 207647 proposes a circuit arrangement for the overvoltage protection of a load which is connected to a DC voltage supply, in which both a first series connection of a varistor and the switching path of a bipolar switching transistor and a second series connection of a Z-diode and a capacitor are arranged in parallel with the load, the inner connection point of the second series connection being connected to the gate electrode of the switching transistor via a limiting resistor. Here, the threshold value of the overvoltage on the supply side for activating the voltage limitation disadvantageously depends on the power supply factor of the switching transistor and, in addition, is noticeably delayed by the capacitor. Analog disadvantages exist in connection with the undershooting of the threshold value.

SUMMARY OF THE INVENTION

Therefore, the object of the present invention is to provide low power loss overvoltage protection for a power transistor which permits in an unlimited manner.

The present invention provides an apparatus for overvoltage protection of a power transistor, the power transistor for controlling an inductive load connected in series with a switching path of the power transistor. The apparatus includes a first varistor bridging supply connections and a second varistor connected in series with a switching path of a switching transistor. The second varistor and the switching transistor are together connected in parallel with the switching path of the power transistor. A Zener diode is connected in series with an ohmic voltage divider, a divided voltage of the ohmic voltage divider controlling the switching transistor. The Zener diode and the ohmic voltage divider are together connected in parallel with the inductive load and the switching path of the power transistor together.

When a high overvoltage occurs at the supply connections, for example, due to the action of a lightning, the overvoltage is limited by the first varistor to the level of its terminal voltage in a usual manner. A further voltage limitation for the power transistor is accomplished in such a manner that, as a result of the Z-diode (Zener diode) becoming conductive, the switching transistor is enabled and, consequently, the blocking voltage for the switching path of the power transistor is limited to the terminal voltage level of the second varistor. The terminal voltage of the second varistor must be selected to be both considerably lower than the terminal voltage of the first varistor and, with sufficient reliability, to be lower than the maximum permissible blocking voltage of the power transistor. Due to the resistive component of the inductive load, the current is sufficiently limited by the switching transistor. Below the breakdown voltage of the Z-diode, as a result of the blocked switching transistor, no parasitic current occurs parallel to the controlling power transistor.

BRIEF DESCRIPTION OF THE DRAWING

Further details and advantages of the present invention will be explained based on an exemplary embodiment which will be explained with reference to the drawing, in which.

DETAILED DESCRIPTION

Figure 1:
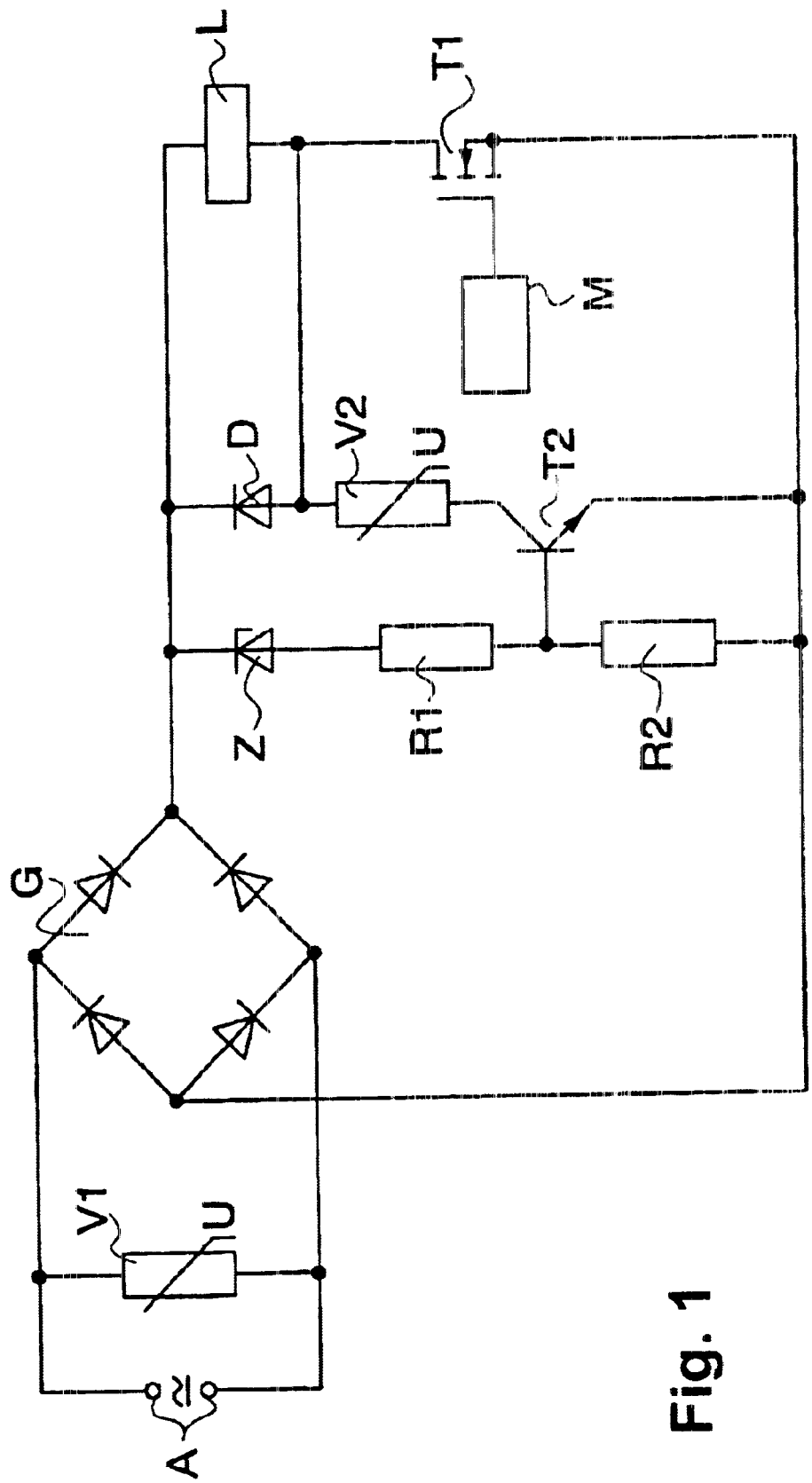
FIG. 1 shows a circuit diagram of a circuit arrangement according to an embodiment of the present invention for the overvoltage protection of a power transistor for controlling an inductive load.

FIG. 1 shows a circuit diagram of a circuit arrangement for the overvoltage protection of a power transistor for controlling an inductive load which, in this case, is the drive coil of a magnetic drive, for example, for an electromagnetic switching device. The AC or DC supply voltage applied to supply connections A is limited by a first varistor V1 to a relatively high value, for example, 1400 V. The terminal voltage of the first varistor was selected to be relatively high to prevent it from thermal overloading by the transverse current in the permissible range of a relatively high supply voltage up to a maximum effective value of 625 V at AC. The supply voltage conducted via bridge rectifier assembly G reaches the series connection of an inductive load L in the form of a drive coil and the switching path of a power transistor T1 whose gate electrode is controlled by a pulse-width modulator M. The voltage limitation caused by first varistor VI does not constitute any effective overvoltage protection for power transistor T1 having a maximum blocking voltage of, for example, 1200 V which, thus, lies below the terminal voltage of first varistor V1. A series connection composed of a Z-diode Z and a voltage divider including two resistors R1 and R2 is connected in parallel with the output of rectifier assembly G. The division point of voltage divider R1, R2 is connected to the gate electrode of a switching transistor T2 whose switching path is connected in series to a second varistor V2 in parallel with the switching path of the power transistor T1 to be protected. After the breakdown voltage of the Z-diode is exceeded, for example at 880 V, a voltage builds up at the division point of voltage divider R1, R2 which causes switching transistor T2 to be enabled. Thus, second varistor V2 is actively connected to the output side of rectifier assembly G via the ohmic a resistance, i.e., the winding resistance of inductive load L. The terminal voltage of second varistor V2, being, for example, 950 V, lies significantly far below the terminal voltage of first varistor V1, but with sufficient safety margin below the maximum permissible blocking voltage of power transistor T1. A free-wheeling diode D is connected to inductive load in a usual manner. When the overvoltage falls below 950 V again on the incoming side, the voltage limitation via second varistor V2 is omitted and, when it falls further below 880 V, switching transistor T2 is blocked and second varistor V2 becomes inactive whereby the normal operating conditions are restored again.

The present invention is not limited to the specific embodiment described above but includes also all equally acting embodiments along the lines of the present invention. Thus, the present invention can also be modified to the effect that, when exclusively using a DC supply voltage, rectifier assembly G may be omitted and, consequently, supply connections A are directly connected to the remaining part of the circuit.

What is claimed is:

1. An apparatus for overvoltage protection of a power transistor, the power transistor for controlling an inductive load connected in series with a switching path of the power transistor, the apparatus comprising:

a first varistor bridging supply connections;

a second varistor connected in series with a switching path of a switching transistor, the second varistor and the switching transistor together being connected in parallel with the switching path of the power transistor; and a Zener diode connected in series with an ohmic voltage divider, a divided voltage of the ohmic voltage divider controlling the switching transistor, the Zener diode and the ohmic voltage divider together being connected in parallel with the inductive load and the switching path of the power transistor together.

2. The apparatus as recited in claim 1 further comprising a rectifier assembly connected on an incoming side to the supply connections and to the first varistor and on an output side to a remaining portion of the apparatus.

3. The apparatus as recited in claim 1 wherein the power transistor is configured for controlling the inductive load in a pulse-width control mode.

4. The apparatus as recited in claim 1 wherein the inductive load includes a drive coil of a magnetic drive.

5. The apparatus as recited in claim 4 wherein the magnetic drive is configured for driving an electromagnetic switching device.

* * * * *